United States Patent
Koyama

(10) Patent No.: US 10,594,260 B2
(45) Date of Patent: Mar. 17, 2020

(54) ELEMENT THAT OSCILLATES OR DETECTS TERAHERTZ WAVES

(71) Applicant: CANON KABUSHIKI KAISHA, Tokyo (JP)

(72) Inventor: Yasushi Koyama, Kamakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/983,649

(22) Filed: May 18, 2018

(65) Prior Publication Data

US 2018/0269835 A1   Sep. 20, 2018

Related U.S. Application Data

(63) Continuation of application No. 15/121,703, filed as application No. PCT/JP2015/056023 on Feb. 24, 2015, now Pat. No. 9,998,074.

(30) Foreign Application Priority Data

Feb. 28, 2014  (JP) .................................. 2014-039031
Feb. 4, 2015   (JP) .................................. 2015-020635

(51) Int. Cl.
| | | |
|---|---|---|
| *H03B 7/08* | (2006.01) | |
| *H03B 9/12* | (2006.01) | |
| *H03H 7/01* | (2006.01) | |
| *H03H 11/52* | (2006.01) | |

(52) U.S. Cl.
CPC ................. *H03B 7/08* (2013.01); *H03B 9/12* (2013.01); *H03H 7/0123* (2013.01); *H03H 11/52* (2013.01); *H03B 2009/123* (2013.01)

(58) Field of Classification Search
CPC ...... H03B 7/08; H03B 9/12; H03B 2009/123; H03H 7/0123; H03H 11/52
USPC ................................. 331/107 T, 96, 115, 132
See application file for complete search history.

(56) References Cited

U.S. PATENT DOCUMENTS

2012/0105161 A1* 5/2012 Ouchi ...................... H03B 9/12
                                                    331/107 T

* cited by examiner

*Primary Examiner* — Arnold M Kinkead
(74) *Attorney, Agent, or Firm* — Canon U.S.A., Inc. I.P. Division

(57) ABSTRACT

An element which oscillates or detects terahertz waves includes a resonance unit including a differential negative resistance element, a first conductor, a second conductor, and a dielectric body, a bias circuit configured to supply a bias voltage to the differential negative resistance element, and a line configured to connect the resonance unit and the bias circuit to each other. The differential negative resistance element and the dielectric body are disposed between the first and second conductors. The line is a low impedance line in a frequency $f_{LC}$ of resonance caused by inductance of the line and capacitance of the resonance unit using an absolute value of a differential negative resistance of the differential negative resistance element as a reference.

11 Claims, 11 Drawing Sheets

ELEMENT THAT OSCILLATES OR DETECTS TERAHERTZ WAVES

CROSS-REFERENCE TO RELATED APPLICATIONS

This application is a continuation, and claims the benefit, of U.S. patent application Ser. No. 15/121,703 filed on Aug. 25, 2016 (now U.S. Pat. No. 9,998,074), which is a U.S. National Stage Entry of PCT/JP2015/056023 filed Feb. 24, 2015, which claims priority from Japanese Patent Application 2015-020635 filed Feb. 4, 2015 and from Japanese Patent Application No. 2014-039031 filed on Feb. 28, 2014. Each of U.S. patent application Ser. No. 15/121,703, U.S. National Stage Entry of PCT/JP2015/056023, Japanese Patent Application 2015-020635, and Japanese Patent Application No. 2014-039031 is hereby incorporated by reference herein in its entirety.

TECHNICAL FIELD

The present invention relates to an element which oscillates or detects terahertz waves.

BACKGROUND ART

Oscillators including a resonator integrated in a negative resistance element have been widely used as current injection light sources which generate electromagnetic waves (hereinafter referred to as "terahertz waves") in a frequency domain from a millimeter waveband to a terahertz waveband (from 30 GHz inclusive to 30 THz inclusive). PTL 1 discloses an oscillator for terahertz waves which includes a double barrier resonant tunneling diode (hereinafter simply referred to as an "RTD" where appropriate) serving as a negative resistance element and a micro-strip resonator which are integrated in the same substrate.

Oscillators using a negative resistance element usually generate parasitic oscillation caused by a bias circuit which includes a power source and wiring which are used to control a bias voltage of the negative resistance element. The parasitic oscillation generated in a lower frequency band other than a desired frequency deteriorates oscillation output in the desired frequency.

To suppress the parasitic oscillation, assuming that a wavelength of a terahertz wave oscillated by the oscillator is denoted by $\lambda_{THz}$ and an oscillation frequency is denoted by $f_{THz}$, impedance on a bias circuit side is reduced in a frequency domain equal to or larger than DC and smaller than $f_{THz}$. To address this problem, a method for arranging a circuit including a resistance and a capacitance in a position within $\lambda_{THz}/4$ on a power source side viewed from the RTD has been proposed.

As a device which realizes this method, NPL 1 discloses an oscillator employing a slot resonator. In NPL 1, as illustrated in FIG. 11, a rectifying diode 15 is disposed in a position within $\lambda_{THz}/4$ on a power source 16 side viewed from S-RTD 11. Note that a resistance 17 is obtained by adding an internal resistance of the power source 16 and a resistance of a connecting wire to each other.

The method employed in NPL 1 is employed only for slot resonators, and therefore, it is difficult to employ the method in oscillators employing a microstrip resonator, such as a patch antenna disclosed in PTL 1. This is because, if the resonator is a patch antenna, for example, a region within $\lambda_{THz}/4$ on a bias circuit side viewed from a negative resistance element includes the patch antenna or peripherals of the patch antenna which are arranged close to the patch antenna. Therefore, in microstrip resonators, it is difficult to arrange a circuit such that the circuit does not interfere with a resonator.

Furthermore, since a line structure for controlling a bias voltage of the negative resistance element is arranged close to the resonator, parasitic oscillation of comparatively high frequencies caused by the structure is required to be reduced.

CITATION LIST

Patent Literature

PTL 1 U.S. Patent Application Publication No. 2006/0055476

Non Patent Literature

NPL 1 IEEE Electron Device Letters, Vol 18,218 (1997)

SUMMARY OF INVENTION

The present invention provides an element which oscillates or detects terahertz waves and which includes a resonance unit including a differential negative resistance element, a first conductor, a second conductor, and a dielectric body, a bias circuit configured to supply a bias voltage to the differential negative resistance element, and a line configured to connect the resonance unit and the bias circuit to each other. The differential negative resistance element and the dielectric body are disposed between the first and second conductors, and the line is a low impedance line in a frequency $f_{LC}$ of resonance caused by inductance of the line and capacitance of the resonance unit using an absolute value of a differential negative resistance of the differential negative resistance element as a reference.

Further features of the present invention will become apparent from the following description of exemplary embodiments with reference to the attached drawings.

DESCRIPTION OF EMBODIMENTS

Figure 1A:
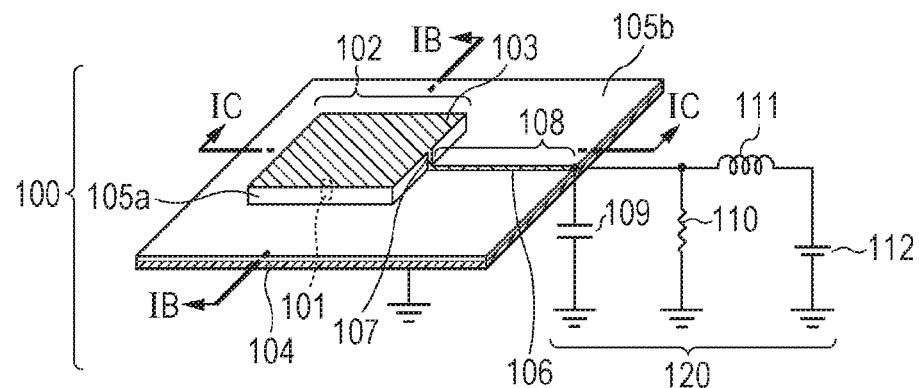
FIG. 1A is a perspective view of a configuration of an element according to an embodiment.
Figure 1B:
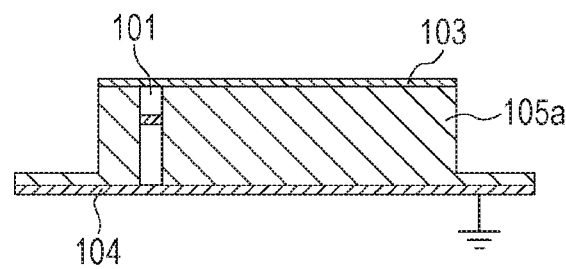
FIG. 1B is a sectional view of the element according to the embodiment taken along a line IB-IB of FIG. 1A.
Figure 1C:
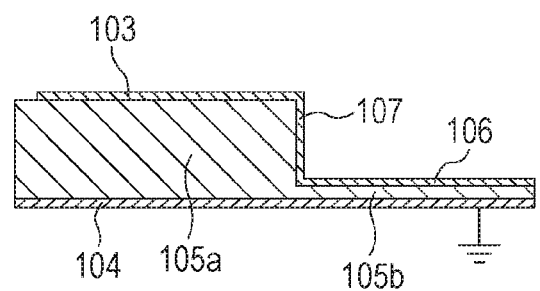
FIG. 1C is a sectional view of the element according to the embodiment taken along a line IC-IC of FIG. 1A.

An element 100 according to an embodiment will be described. The element 100 is an oscillator which oscillates electromagnetic waves of an oscillation frequency (a resonance frequency) $f_{THz}$. FIG. 1A is a perspective view of the element 100 according to this embodiment, FIG. 1B is a sectional view of the element 100 taken along a line IB-IB of FIG. 1A, and FIG. 1C is a sectional view of the element 100 taken along a line IC-IC of FIG. 1A. Note that the element 100 is referred to as an "oscillator 100" hereinafter.

A configuration of the oscillator 100 will now be described. The oscillator 100 includes a resonance unit 102, a line 108, and a bias circuit 120. The resonance unit 102 includes a resonator of a terahertz band including a patch conductor (first conductor) 103, a grounding conductor (second conductor) 104, and a first dielectric body 105a and a differential negative resistance element 101 (hereinafter referred to as an "element 101").

In the element 101, a region in which a current is reduced when a voltage is increased, that is, a region having negative resistance (a differential negative resistance region), appears as a current-voltage characteristic. A high frequency element, such as an RTD, an Esaki diode, Gunn diode, or a transistor having one terminated end, is typically used as a preferred element 101. Alternatively, a TUNNETT diode, an IMPATT diode, a heterojunction bipolar transistor (HBT), a compound semiconductor FET, or a high-electron-mobility transistor (HEMT) may be used. Furthermore, a differential negative resister of a Josephson device employing a superconductor may be used. In this embodiment, a case where a resonant tunneling diode (RTD) which is a typical differential negative resistance element operating in a terahertz band is used as the element 101 will be described as an example.

The resonance unit 102 which is an active antenna includes a resonator and the element 101 integrated thereon. The resonator of a terahertz wave includes the patch conductor 103, the grounding conductor 104, and the dielectric body 105a disposed between the patch conductor 103 and the grounding conductor 104. The configuration in which the first dielectric body 105a is sandwiched between the patch conductor 103 and the grounding conductor 104 is widely used in microstrip resonators using a microstrip line having a finite length or the like. In this embodiment, a patch antenna is used as the resonator for terahertz waves.

The patch antenna is set such that a width of the patch conductor 103 in a direction of a line IB-IB corresponds to $\lambda/2$ resonator. The element 101 is disposed between the patch conductor 103 and the grounding conductor 104. In this embodiment, the resonance unit 102 is configured such that the element 101 and the resonator of a terahertz band, such as the patch antenna, are integrated.

Here, in this specification, the term "dielectric body" is a material which has a dielectric property superior to conductivity and which serves as an insulating body or a high resistive body which blocks electricity relative to direct voltage. Typically, a material having a resistivity of 1 kΩ·m or more is preferably used. Specifically, plastic, ceramic, silicon oxide, silicon nitride, or the like is preferably used.

The resonance unit 102 is an active antenna including the patch antenna and the differential negative resistance element 101 integrated thereon. Therefore, the oscillation frequency $f_{THz}$ defined by the resonance unit 102 of the oscillator 100 is determined as a resonance frequency of a whole parallel resonance circuit configured such that reactance of the patch antenna and reactance of the differential negative resistance element 101 are combined with each other. That is, the oscillator 100 oscillates terahertz waves of the oscillation frequency $f_{THz}$.

Specifically, according to an equivalent circuit of an RTD oscillator disclosed in Jpn. J. Appl. Phys., Vol. 47, No. 6, 4375 (2008), for a resonance circuit configured such that an RTD and admittance ($Y_{RTD}$ and $Y_{ANT}$) of an antenna are combined with each other, a frequency which satisfies two conditions, that is, an amplitude condition represented by Expression (1) and a phase condition represented by Expression (2), is determined as the oscillation frequency $f_{THz}$. Here, Re[$Y_{RTD}$] represents admittance of the element 101 and has a negative value.

$$Re[Y_{RTD}] + Re[Y_{ANT}] \leq 0 \quad (1)$$

$$Im[Y_{RTD}] + Im[Y_{ANT}] = 0 \quad (2)$$

The bias circuit 120 which supplies a bias voltage to the element 101 includes a resistance 110 connected in parallel to the element 101, a capacitance 109 connected in parallel to the resistance 110, a power source 112, and a line 111. The line 111 constantly has a parasitic inductance component, and therefore, the line 111 is represented as an inductance in FIG. 1A. The power source 112 supplies current required for driving the element 101 and controls the bias voltage. The bias voltage is typically selected from the differential negative resistance region of the element 101.

The line 108 is a distributed constant line. The bias voltage is supplied from the bias circuit 120 through the line 108 to the element 101. The line 108 of this embodiment is a microstrip line. The line 108 includes a strip conductor (third conductor) 106, the grounding conductor (fourth conductor) 104, a second dielectric body 105b, and a fifth conductor 107, and is configured such that the second dielectric body 105b is sandwiched between the strip conductor 106 and the grounding conductor 104. The strip conductor 106 and the patch conductor 103 are electrically connected to each other through the fifth conductor 107.

A thickness of the second dielectric body 105b is smaller than that of the first dielectric body 105a. Therefore, the fifth conductor 107 serves as a plug for covering a gap (difference in height) between the first dielectric body 105a and the second dielectric body 105b and electrically and physically connecting the patch conductor 103 and the strip conductor 106 to each other. In this way, the resonance unit 102 and the line 108 are coupled with each other by DC coupling. Note that, although the second conductor of the resonance unit 102 and the fourth conductor of the line 108 both correspond to the grounding conductor 104 in the same layer in this embodiment, different conductors may be employed.

The resistance 110 and the capacitance 109 of the bias circuit 120 suppress parasitic oscillation of a resonance frequency $f_{sp}$ ($f_{sp} < f_{LC} < f_{THz}$, and typically, in a frequency band from DC to 10 GHz) which is a comparatively low frequency caused by the bias circuit 120. Here, the frequency $f_{LC}$ is a frequency of an LC resonance of an inductance L of the line 108 and a capacitance $C_{ANT}$ of the resonance unit 102 having the element 101 and the patch antenna. The frequency $f_{LC}$ will be described in detail hereinafter.

A value of the resistance 110 is preferably equal to or slightly smaller than an absolute value of the differential negative resistance in the differential negative resistance region of the element 101. The resistance 110 is located in a position away from the element 101 by a distance $d_2$. Then, mainly in a wavelength band of $4 \times d_2$ or more, a portion of the bias circuit 120 on an outside relative to the resistance 110 has a low impedance relative to the element 101, that is, a low impedance when using the absolute value of the differential negative resistance of the element 101 as a reference. That is, the resistance 110 is preferably set such that the resistance 110 has a low impedance relative to the element 101 in a frequency band equal to or smaller than the frequency $f_{SP}$ ($f_{SP} < f_{LC} < f_{THz}$).

As with the resistance 110, the capacitance 109 is set such that the impedance of the capacitance 109 is equal to or slightly smaller than the absolute value of the differential negative resistance of the element 101. In general, the capacitance 109 is preferably large and is approximately several tens of pF in this embodiment. The capacitance 109 is a decoupling capacitance directly coupled with the microstrip line serving as the line 108, and may have an MIM (Metal-insulator-Metal) structure including a substrate (not illustrated) shared by the resonance unit 102, for example.

In configurations in the related art, an LC resonance of a frequency $f_{LC}$ ($f_{LC} \approx 1/(2\Pi\sqrt{(LC_{ANT})})$, $f_{SP} < f_{LC} < f_{THz}$) caused by an inductance L of a line and a capacitance $C_{ANT}$ of a differential negative resistance element and the resonance unit may be formed. The frequency $f_{LC}$ is determined mainly using capacitance of a differential negative resistance element, a length and a width of a line (the microstrip line in this embodiment), an area of a patch antenna, a thickness of a dielectric body, and the like, and is typically in a range from 10 GHz inclusive to 500 GHz inclusive.

Due to a configuration of a patch antenna, it is difficult to directly connect a bias circuit to a resonance unit without interference with a resonance electric field of an oscillation frequency $f_{THz}$. Therefore, to supply a bias voltage to an element, a bias circuit and a resonance unit are connected to each other through a line serving as a power supply line, and accordingly, parasitic oscillation of a frequency $f_{LC}$ may be generated due to a gain of the element 101.

In the oscillator 100, the resonance unit 102 including the element 101 and the patch antenna is connected to the bias circuit 120 including the resistance 110 and the capacitance 109 through the line 108 serving as the distributed constant line. Accordingly, the line 108 serving as the distributed constant line is used to connect the capacitance 109 which is the decoupling capacitance of the bias circuit 120 and the resonance unit 102 including the patch antenna to each other. The oscillator 100 of this embodiment is an active patch antenna which is configured such that the element 101 and the first dielectric body 105a are sandwiched between the two conductors, that is, the patch conductor 103 and the grounding conductor 104. The resistance 110 of the bias circuit 120 which is a shunt resistance and the capacitance 109 which is the decoupling capacitance are connected to the element 101 and the power source 112 in parallel. The line 108 which is the microstrip line is connected between the patch antenna of the resonance unit 102 and the capacitance 109.

In the oscillator 100, the line (microstrip line) 108 has a low impedance relative to the element 101 in a frequency band in the vicinity of the frequency $f_{LC}$ of the LC resonance. The configuration in which the line 108 has a low impedance relative to the element 101 means a configuration in which the line 108 is a low impedance line using the absolute value of the differential negative resistance of the element 101 as a reference.

Here, the low impedance line using the absolute value of the differential negative resistance of the element 101 as a reference means a line having a comparatively low impedance using the absolute value of the differential negative resistance of the element 101 as the reference. The line having the comparatively low impedance typically means a line having an impedance equal to or smaller than a value ten times as large as the absolute value of the differential negative resistance of the differential negative resistance element or preferably equal to or smaller than the absolute value of the differential negative resistance. In general, the absolute value of the differential negative resistance of the differential negative resistance element is approximately equal to or larger than 0.1Ω to equal to or smaller than 100Ω, and therefore, the impedance of the low impedance line is set in a range from approximately 1Ω inclusive to approximately 1000Ω inclusive.

To set the line 108 having the low impedance using the absolute value of the differential negative resistance of the element 101 serving as the reference, a thickness of the line 108 is controlled, for example, so that a characteristic impedance of the line 108 is set to a value ten times as large as the absolute value of the differential negative resistance of the element 101 or less. More preferably, the characteristic impedance of the line 108 is set to a value equal to or smaller than the absolute value of the differential negative resistance of the element 101. Furthermore, an absolute value ($|1/\text{Re}[Y_{RTD}]|$) of a real part of the impedance which is a gain may be used taking a frequency characteristic of the element 101 into consideration. In this case, a line having a characteristic impedance equal to or smaller than a value which is ten times as large as an absolute value ($|1/\text{Re}[Y_{RTD}]|$) of the real part of the impedance of the element 101, or preferably, a line having a characteristic impedance equal to or smaller than the absolute value ($|1/\text{Re}[Y_{RTD}]|$) of the real part of the impedance of the element 101 is used as the line 108.

With this configuration, loss of electromagnetic waves of frequencies in the vicinity of the frequency $f_{LC}$ is large in the line 108. Therefore, since the microstrip line serving as the line 108 is a lossy line, loss of the parasitic LC resonance caused by the line 108 is increased. Accordingly, oscillation of the LC resonance may be blocked or reduced.

Here, when a length of the line 108 is denoted by $d_1$ and a distance from the element 101 to the resistance 110 is denoted by $d_2$, a frequency band in the vicinity of the frequency $f_{LC}$ corresponds to a wavelength band equal to or larger than $4 \times d_1$ and equal to or smaller than $4 \times d_2$ when the frequency band is converted into the wavelength. The wavelength band is determined in accordance with arrangement and structures of the line 108 and the resistance 110, and is typically a range from several GHz inclusive to 500 GHz inclusive.

Note that the configuration represented by the expression "the line 108 is a low impedance line using the absolute value of the differential negative resistance of the element 101 as a reference" in this specification may be easily designed taking the characteristic impedance of the line 108 into consideration. Specifically, the line 108 is designed such that the characteristic impedance of the line 108 is equal to or smaller than a value which is ten times as large as the absolute value of the differential negative resistance of the element 101 or preferably, the characteristic impedance of the line 108 is equal to or smaller than the absolute value of the differential negative resistance of the element 101. In this case, the line 108 is a low impedance line relative to the absolute value of the differential negative resistance of the differential negative resistance element 101 serving as a reference.

When the impedance of the line 108 relative to the element 101 in the frequency $f_{LC}$ is equal to or smaller than the value which is as large as ten times the absolute value of the differential negative resistance, loss of the gain of the element 101 caused by the line 108 is not negligible, and therefore, the oscillation of the LC resonance may be suppressed. In particular, the lower the impedance of the line 108 relative to the element 101 in the frequency $f_{LC}$ is, the larger the loss of the electromagnetic waves of this frequency band of the line 108 is, and accordingly, the oscillation of the LC resonance is efficiently suppressed. When the impedance of the line 108 relative to the element 101 in the frequency $f_{LC}$ is equal to or smaller than the absolute value of the differential negative resistance, the loss is larger than the gain of the element 101, and accordingly, oscillation of the LC resonance may be blocked.

Furthermore, when the impedance of the line 108 is designed to be low relative to the element 101, a structure and a configuration which attain the effect described above may be realized. Furthermore, as a structure in which the impedance is low in the line 108 relative to the element 101 is located closer to the element 101 or the resonance unit 102, the oscillation of the LC resonance is more effectively suppressed. Specifically, the structure is preferably located in a distance equal to or smaller than $\lambda_{THz}$ from the element 101. Note that "$\lambda_{THz}$" is a wavelength of a terahertz wave of the oscillation frequency $f_{THz}$.

With this configuration, due to the effect of the loss of the line 108, Expression (1) is not satisfied in a low frequency domain smaller than $f_{THz}$ including frequencies $f_{sp}$ and $f_{LC}$, and the following expression is satisfied: $Re[Y_{RTD}]+Re[Y_{ANT}]>0$. On the other hand, in a frequency domain in the vicinity of the oscillation frequency $f_{THz}$, a structure which satisfies Expression (1) may be realized. Here, "$Re[Y_{RTD}]$" represents a negative value and approximates an inverse number of the differential negative resistance of the differential negative resistance element 101 in DC. Accordingly, the oscillation of the LC resonance may be suppressed, and terahertz waves of the oscillation frequency $f_{THz}$ may be obtained.

Loss of a distributed constant line, such as the line 108, includes conductor loss caused by a skin effect and dielectric loss caused by a dielectric tangent (tan δ). On an equivalent circuit of a distributed constant line, the conductor loss and the dielectric loss are represented by a resistance R connected to an inductance L in series and a leakage conductance G connected to a capacitance in parallel, respectively. The leakage conductance G is represented by an equation "$G=\tan \delta \times \omega \times C$", and therefore, as a frequency becomes higher, such as frequencies of terahertz waves, the dielectric loss is not negligible. Furthermore, the dielectric loss corresponds to an increasing function of the dielectric tangent tan δ and the capacitance C of the line 108.

Accordingly, when a material and a structure of the line 108 are selected and the dielectric tangent tan δ and the capacitance C of the line 108 are appropriately selected, the leakage conductance G of electromagnetic waves in the vicinity of the frequency $f_{LC}$ of the line 108 may be increased and the dielectric loss in the vicinity of the frequency $f_{LC}$ may be increased. Specifically, the dielectric tangent tan δ and the capacitance C of the line 108 are selected such that the dielectric loss becomes equal to or larger than one-tenth of an absolute value of an inverse number of the differential negative resistance of the element 101, or more preferably, equal to or larger than the absolute value of the inverse number of the differential negative resistance. With this configuration, the oscillation in the vicinity of the frequency $f_{LC}$ is efficiently suppressed.

For example, when a thickness of the dielectric body 105b is sufficiently small, the capacitance C of the microstrip line 108 is increased, and accordingly, the dielectric loss is increased in the vicinity of the frequency $f_{LC}$ and the line 108 becomes a low impedance line relative to the absolute value of the differential negative resistance of the element 101 serving as a reference. Specifically, although depending on a type of the dielectric body 105b, typically, when the thickness of the dielectric body 105b is equal to or larger than 0.001 μm and equal to or smaller than 1 μm, the characteristic impedance of the microstrip line 108 in the vicinity of the frequency $f_{LC}$ is equal to or larger than 1Ω and equal to or smaller than 100Ω. Although depending on a structure, the absolute value of the differential negative resistance of the element 101 is approximately equal to or larger than 1Ω and equal to or smaller than 100Ω.

Therefore, the characteristic impedance may be set to a value equal to or smaller than a value ten times as large as the absolute value of the differential negative resistance of the element 101 or equal to or smaller than the absolute value of the differential negative resistance by controlling the thickness of the line 108. In this case, the impedance of the line 108 relative to the element 101 is equal to or smaller than a value ten times as large as the absolute value of the differential negative resistance or equal to or smaller than the absolute value of the differential negative resistance. As a result, the dielectric loss of the microstrip line 108 in the vicinity of the frequency $f_{LC}$ is increased, and accordingly, the oscillation of the LC resonance may be suppressed or blocked.

Since the thickness of the second dielectric body 105b is smaller than the thickness of the first dielectric body 105a of the resonance unit 102, the patch antenna serving as a resonator/radiator for terahertz waves may increase only loss of the line 108 while maintaining low loss and high radiation efficiency. Specifically, electromagnetic waves of the oscillation frequency $f_{THz}$ may maintain the low loss and the high radiation efficiency in the resonance unit 102 and increase loss of the electric waves in the frequency $f_{LC}$ in the microstrip line 108.

Figure 9A:
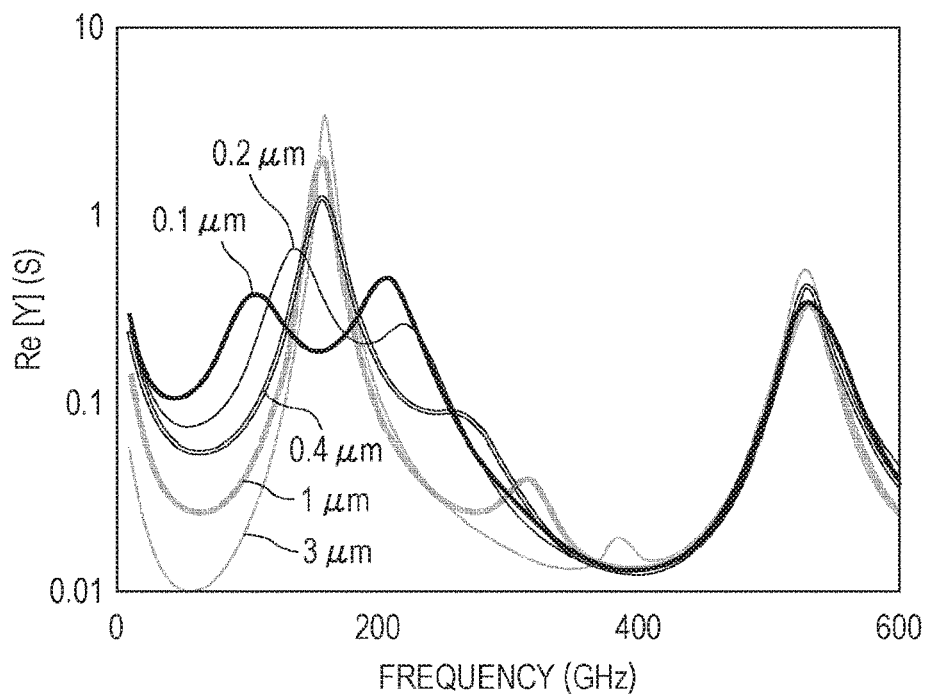
FIG. 9A is a diagram illustrating dependence of a thickness of a dielectric body of a real part of admittance of the element according to the embodiment.
Figure 9B:
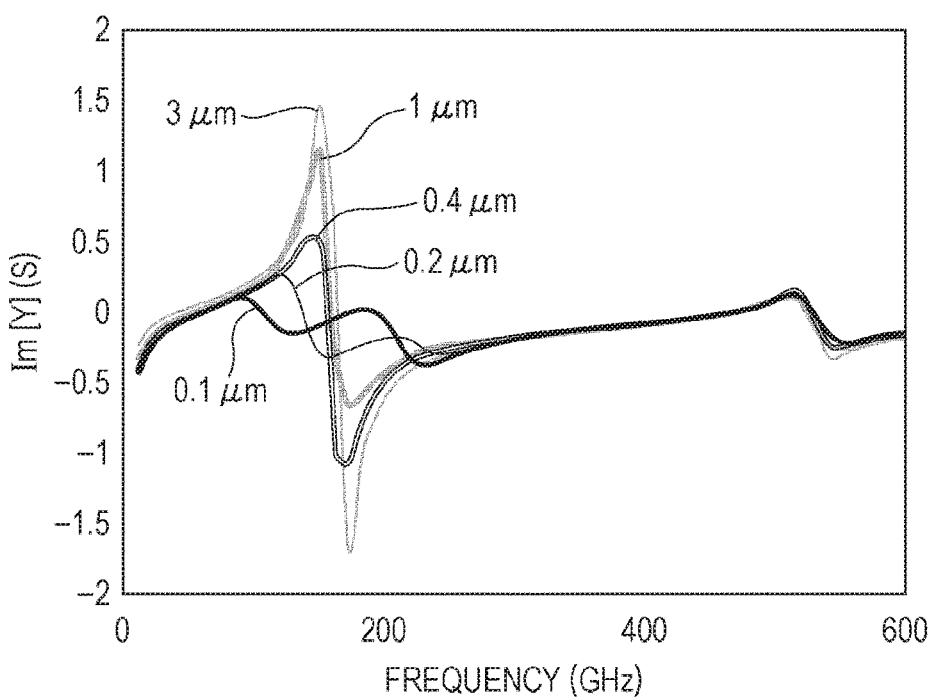
FIG. 9B is a diagram illustrating dependence of the thickness of the dielectric body of an imaginary part of the admittance of the element according to the embodiment.

FIG. 9A is a graph obtained by plotting a result of analysis of dependence of a thickness of the dielectric body 105b of the real part of the admittance of the oscillator 100. FIG. 9B is a graph obtained by plotting a result of analysis of dependence of the thickness of the dielectric body 105b of the imaginary part of the admittance of the oscillator 100. As illustrated in FIGS. 9A and 9B, silicon nitride frequently used in semiconductor fabrication is used as the second dielectric body 105b. In a case of a general oscillator including the second dielectric body 105b of 3 μm, admittance of a value equal to or smaller than 10 mS is obtained in the vicinity of the frequency $f_{LC}$ (≈0.08 THz), that is, low loss (high impedance) configuration is obtained. On the other hand, in the oscillator 100, when the film thickness is made thin in a range from 1 μm inclusive to 0.1 μm inclusive, change of admittance in the vicinity of the oscillation frequency $f_{THz}$ is minimum and admittance in the vicinity of the frequency $f_{LC}$ may be arbitrarily controlled from 10 mS to 100 mS or more.

In this way, the thickness of the second dielectric body 105b of the line 108 is set such that the thickness of the second dielectric body 105b is smaller than that of the first dielectric body 105a of the resonance unit 102. By this, a difference between equivalent refractive indices of the line 108 and the resonance unit 102 becomes large, and accordingly, impedance mismatching occurs in a portion in which the resonance unit 102 and the line 108 are connected to each other. Therefore, when the dielectric body 105b becomes thin, the LC resonance of the frequency $f_{LC}$ caused by the capacitance of the resonance unit 102 including the antenna and the inductance of the line 108 is divided into resonance caused by the capacitance of the resonance unit 102 and resonance caused by the inductance of the line 108. Consequently, two resonance points having similar frequencies are generated in positions before and after the frequency $f_{LC}$, and low impedance bands are generated in positions before and after the frequency $f_{LC}$.

Furthermore, when a material having a large dielectric tangent tan δ is used as the dielectric body 105b, the dielectric loss of the electromagnetic waves in the vicinity of the frequency $f_{LC}$ may be increased without changing a structure size of the line 108. Examples of the material having a large dielectric tangent tan δ in the frequency $f_{LC}$ include silicon nitride, polyaramide, polyethylene terephthalate, PMMA, ABS, and polycarbonate. Furthermore, a substance obtained by distributing fine powder of a metal filler or carbon graphite on a synthetic resin in which a magnitude of dielectric loss has electric field intensity dependence, such as styrol or epoxy, may be used. Moreover, a metamaterial structure having a large dielectric tangent tan δ in the frequency $f_{LC}$ may be used.

Here, the length $d_1$ of the line 108 is preferably large as long as a conductor resistance does not become considerably large, and is preferably equal to or larger than $\lambda_{THz}/4$. Note that "$\lambda_{THz}$" represents a wavelength of terahertz waves of the oscillation frequency $f_{THz}$.

Figure 10A:
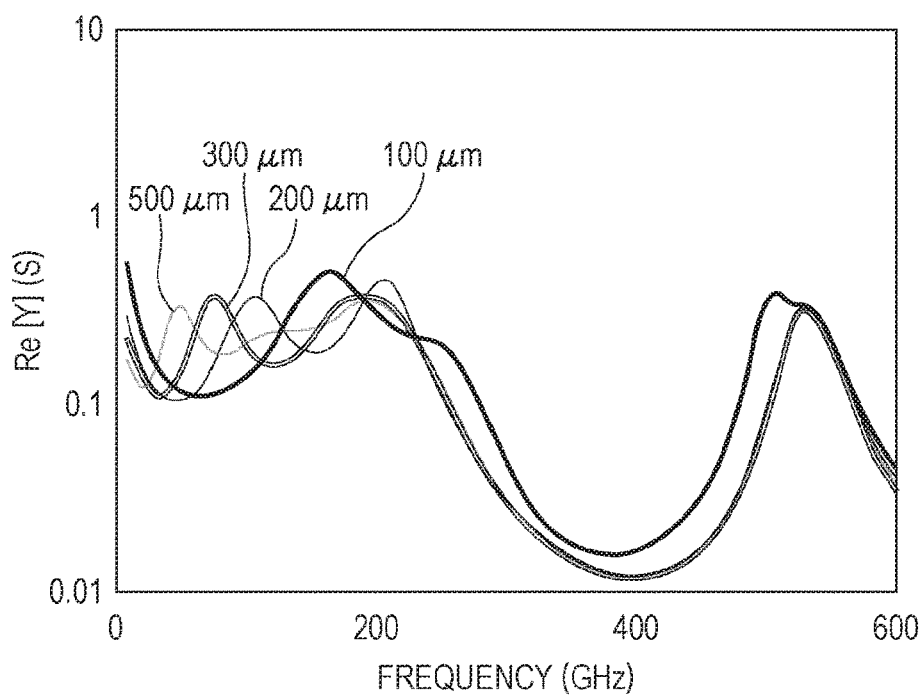
FIG. 10A is a diagram illustrating dependence of a length of a line of the real part of the admittance of the element according to the embodiment.
Figure 10B:
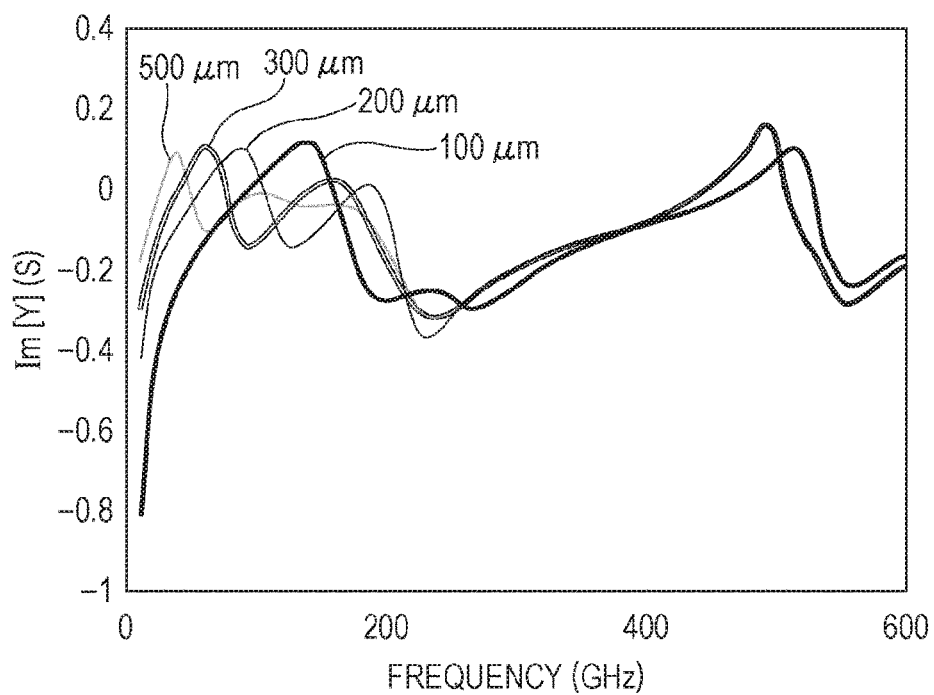
FIG. 10B is a diagram illustrating dependence of the length of the line of the imaginary part of the admittance of the element according to the embodiment.
Figure 11:
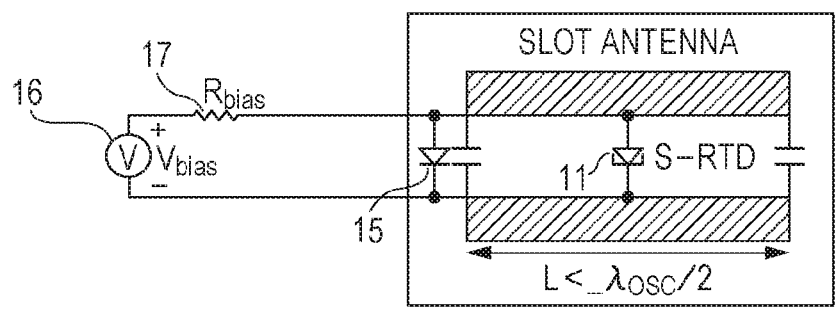
FIG. 11 is a diagram illustrating a configuration of an oscillator disclosed in the related art.

FIG. 10A is a graph obtained by plotting a result of analysis of dependence of a length of the line 108 of the real part of the admittance of the oscillator 100. FIG. 10B is a graph obtained by plotting a result of analysis of dependence of the length of the line 108 of an imaginary part of the admittance of the oscillator 100. FIGS. 10A and 10B represent the real part and the imaginary part of the admittance of the oscillator 100 obtained when the length of the line 108 is set to 100 μm, 200 μm, 300 μm, 400 μm, and 500 μm. When "$\lambda_{THz}$" represents a wavelength of a terahertz wave in the frequency $f_{THz}$, 100 μm corresponds to $\lambda_{THz}/4$. A long strip conductor 106 causes an increased inductance L and the frequency $f_{LC}$ of the LC resonance is shifted toward a low frequency side. Therefore, influence of loss in the vicinity of the frequency $f_{LC}$ to an electric field of terahertz waves of the oscillation frequency $f_{THz}$ in the resonance unit 102 is suppressed. On the other hand, a short strip conductor 106 causes reduced inductance L and the frequency $f_{LC}$ of the LC resonance is shifted toward a high frequency side.

As a result, the influence of the oscillation frequency $f_{THz}$ to the electric field of terahertz waves of the oscillation frequency $f_{THz}$ may not be negligible in terms of a distance and a frequency, and accordingly, this causes loss of terahertz waves of the oscillation frequency $f_{THz}$ and multimode. This is because, the length of the line 108 and a frequency band of low impedance in the vicinity of the frequency $f_{LC}$ become large and the frequency $f_{LC}$ shifts on a low frequency side. Therefore, the length of the line 108 is preferably large, and is more preferably equal to or larger than $\lambda_{THz}/4$. Note that, since a large length of the line 108 causes series resistance, the line 108 is appropriately designed taking the relationship between the series resistance and the impedance in the vicinity of the frequency $f_{LC}$ into consideration.

The conductor 107 and the line 108 preferably have widths which do not interfere with the resonance electric field in the resonance unit 102, and the widths are preferably equal to or smaller than $\lambda_{THz}/10$, for example. Furthermore, the conductor 107 and the line 108 are preferably disposed in nodes of electric fields of terahertz waves of the oscillation frequency $f_{THz}$ steadily existing in the resonance unit 102. Here, the line 108 has higher impedance than the absolute value of the differential negative resistance of the element 101 in a frequency band in the vicinity of the oscillation frequency $f_{THz}$. Therefore, influence of the loss of electromagnetic waves in the vicinity of the frequency $f_{LC}$ to the electric field of the oscillation frequency $f_{THz}$ in the resonance unit 102 is suppressed.

Here, the expression "nodes of electric fields of terahertz waves of the oscillation frequency $f_{THz}$ steadily existing in the resonance unit 102" means regions corresponding to substantive nodes of the electric fields of terahertz waves of the oscillation frequency $f_{THz}$ steadily existing in the resonance unit 102. Specifically, the expression "nodes of electric fields of terahertz waves of the oscillation frequency $f_{THz}$ steadily existing in the resonance unit 102" also means regions corresponding to substantive nodes of the electric fields of terahertz waves of the oscillation frequency $f_{THz}$ steadily existing in the patch antenna serving as a resonator for terahertz waves. Specifically, the expression "nodes of electric fields of terahertz waves of the oscillation frequency $f_{THz}$ steadily existing in the resonance unit 102" means regions in which electric field intensity of terahertz waves of the oscillation frequency $f_{THz}$ steadily existing in the resonance unit 102 is lower than the maximum electric field intensity of the terahertz waves of the oscillation frequency $f_{THz}$ steadily existing in the resonance unit 102 by approximately single digit. Preferably, a position in which electric field intensity of terahertz waves of the oscillation frequency $f_{THz}$ is equal to or smaller than $1/e^2$ ("e" is a base of natural logarithm) of the maximum electric field intensity of the terahertz waves of the oscillation frequency $f_{THz}$ steadily existing in the resonance unit 102 is employed.

A result of analysis of an admittance characteristic of an oscillator 200 according to a first concrete example of this embodiment will be described with reference to FIG. 2. A configuration of the oscillator 200 will be described in the first example hereinafter.

Figure 2:
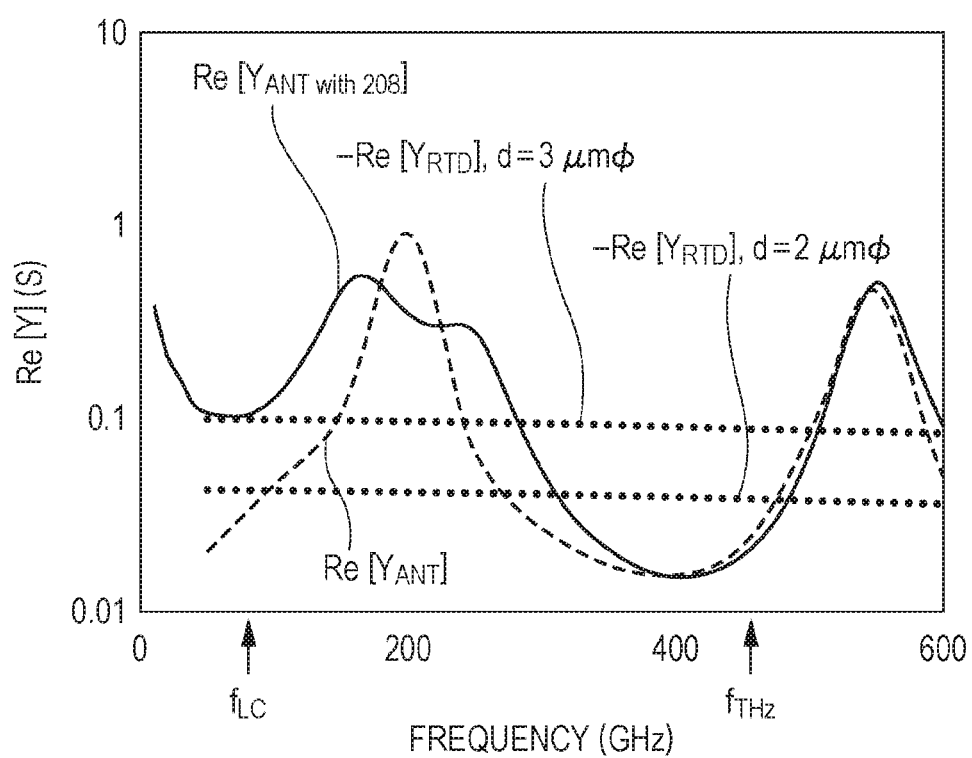
FIG. 2 is a diagram illustrating an admittance characteristic of the element according to the embodiment.

FIG. 2 is a graph illustrating a result of analysis of the admittance characteristic of the oscillator 200 and plotting a real part $Re[Y_{RTD}]$ of admittance of an RTD 201 which is a differential negative resistance element and a real part $Re[Y_{ANT}]$ of admittance of a patch antenna. In the graph, an admittance $Re[Y_{ANT\ with\ 208}]$ of a patch antenna including a line 208 which has low impedance in a frequency band in the vicinity of a frequency $f_{LC}$ in the first example described hereinafter is also illustrated. Furthermore, an admittance $Re[Y_{ANT}]$ of a patch antenna including a general microstrip line having comparatively high impedance as a line is also illustrated.

It is assumed that, in the oscillator 200, an oscillation frequency $f_{THz}$ which satisfies Expression (2) is 0.45 THz and a frequency $f_{LC}$ of an LC resonance is 0.08 THz. In a case of general microstrip lines having comparatively high impedance, the oscillation condition of Expression (1) is satisfied in terms of the frequency $f_{THz}$ and the frequency $f_{LC}$, and therefore, parasitic oscillation having LC resonance may be generated.

On the other hand, when the line (microstrip line) 208 which has low impedance in a frequency band in the vicinity of the frequency $f_{LC}$ according to the first example is employed, impedance in the oscillation frequency $f_{THz}$ is high, and accordingly, the oscillation condition is satisfied. However, in a region of a low frequency in a range which includes the frequency $f_{LC}$ and which is equal to or larger than DC and smaller than the frequency $f_{THz}$, the line 208 has low impedance relative to the RTD 201, and accordingly, the oscillation condition in Expression (1) is not satisfied. Accordingly, with the configuration of the first example, the parasitic oscillation including the LC resonance is suppressed.

As described above, an oscillation circuit is realized such that the oscillator 200 has high impedance in the desired oscillation frequency $f_{THz}$ in the terahertz band and has low impedance in the frequency domain of the parasitic oscillation which includes the LC resonance of the frequency $f_{LC}$ and which is equal to or larger than DC and smaller than the frequency $f_{THz}$. Note that the terms "high impedance" and "low impedance" here mean high impedance and low impedance relative to the RTD 201 (that is, using the RTD 201 as a reference). Accordingly, even oscillators employing a microstrip resonator may suppress low-frequency parasitic oscillation caused by a bias circuit or a power supply structure and stably oscillate terahertz waves of a desired oscillation frequency $f_{THz}$ defined by a resonator.

With this configuration, loss in the oscillation frequency $f_{THz}$ of terahertz waves may be reduced by arbitrarily designing the microstrip resonator and a size and a material of the structure of the distributed constant line. Furthermore, appropriate designing may minimize loss of terahertz waves in the oscillation frequency $f_{THz}$ and maximize loss in a frequency of the parasitic oscillation.

The oscillators of this embodiment and the first example may reduce parasitic oscillation caused by a line structure which is a problem in microstrip resonators including a patch antenna. Specifically, additional generation of parasitic oscillation caused by inductance of a strip conductor used to perform bias power supply to the differential negative resistance element is reduced. Accordingly, parasitic oscillation may be reduced or suppressed in a frequency domain equal to or larger than DC and smaller than the frequency $f_{THz}$ even in the microstrip resonators, and accordingly, terahertz waves of the desired oscillation frequency $f_{THz}$ of the resonators may be more stably obtained.

Furthermore, since terahertz waves of the oscillation frequency $f_{THz}$ are stably obtained, terahertz waves of the desired oscillation frequency $f_{THz}$ in the microstrip resonators may be output at high power.

FIRST EXAMPLE

Figure 3A:
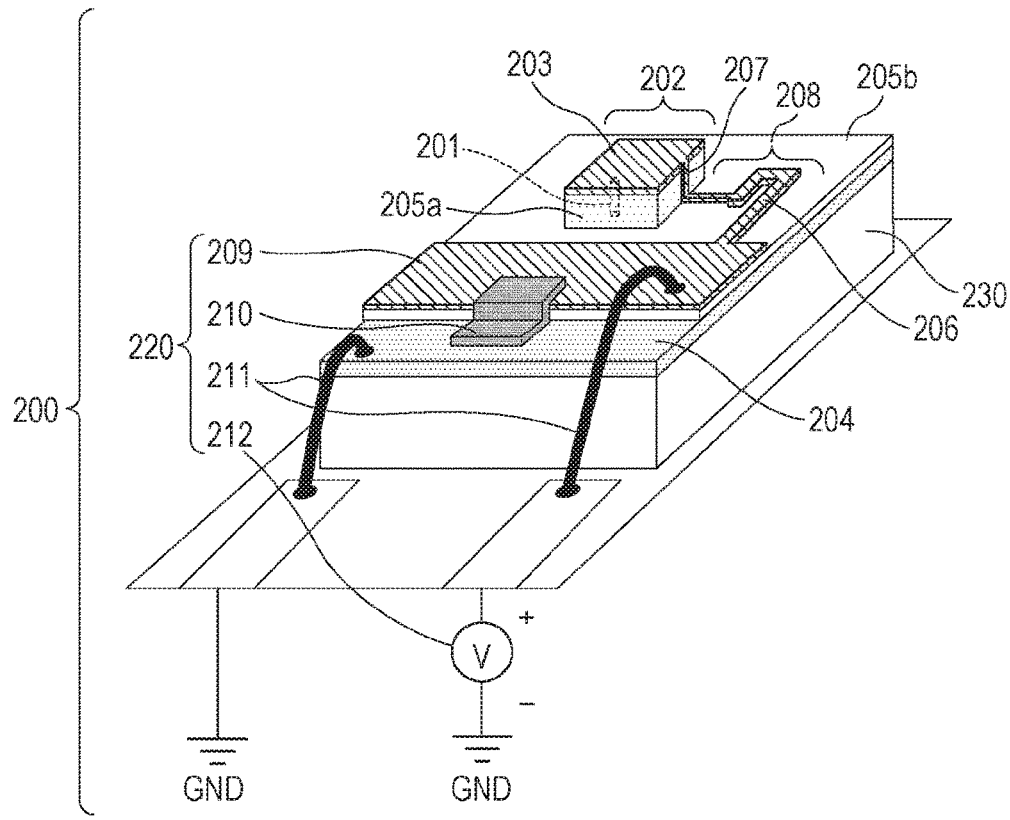
FIG. 3A is a perspective view of a configuration of an element according to a first example.

A configuration of the oscillator 200 which is an element oscillating terahertz waves of this example will be described. FIG. 3A is a perspective view of the oscillator 200. The oscillator 200 is an element which oscillates an oscillation frequency $f_{THz}$ of 0.45 THz. In this example, a resonant tunneling diode (RTD) is used as the differential negative resistance element 201. The RTD 201 of this example has a multiple quantum well structure of InGaAs/InAlAs and InGaAs/AlAs on an InP substrate 230 and an electrical contact layer formed by n-InGaAs.

As the multiple quantum well structure, a triple-barrier structure is used. Specifically, a semiconductor multiple layer structure is configured by AlAs (approximately 1.3 nm)/InGaAs (approximately 7.6 nm)/InAlAs (approximately 2.6 nm)/InGaAs (approximately 5.6 nm)/AlAs (approximately 1.3 nm). In this structure, InGaAs corresponds to a well layer and lattice matching InAlAs and lattice mismatching AlAs correspond to a barrier layer. These layers are undoped layers on which carrier dope is intentionally not performed.

Such a multiple quantum well structure is sandwiched by electric contact layers having an electronic density of $2 \times 10^{18}$ cm$^{-3}$ and formed by n-InGaAs. In a current/voltage I(V) characteristic of a structure between such electric contact layers, a peak current density is 280 kA/cm$^2$, and a range from approximately 0.7 V to approximately 0.9 V corresponds to the differential negative resistance region. When the RTD 201 has a mesa structure having a diameter of approximately 2 μm, a peak current of 10 mA and a differential negative resistance of approximately $-20\Omega$ are obtained.

A resonance unit 202 includes a resonator having a patch conductor 203, a grounding conductor 204, and a first dielectric body 205a and the RTD 201. The resonator includes a square patch antenna having the patch conductor 203 having sides of 200 μm. A BCB (benzocyclobutene, Dow Chemical Company, εr=2.4) having a thickness of approximately 3 μm and a silicon nitride having a thickness of approximately 0.1 μm are sandwiched between the patch conductor 203 and the grounding conductor 204 as a first dielectric body 205a.

The RTD 201 having a diameter of 2 μm is connected between the patch conductor 203 and the grounding conductor 204. The RTD 201 is located in a position shifted from a center of gravity of the patch conductor 203 by approximately 80 μm in a resonance direction. Although solo resonance frequency of the patch antenna is approximately 0.48 THz, an oscillation frequency (resonance frequency) $f_{THz}$ of the oscillator 200 is approximately 0.45 THz taking reactance of the RTD which is the RTD 201 into consideration.

The patch conductor 203 is connected to a strip conductor 206 of a microstrip line of the line 208 through a conductor 207. Accordingly, the patch antenna is connected to an MIM capacitance 209 through the line 208. With this configuration, the line 208 is used to connect a bias circuit 220 and the resonance unit 202 to each other.

The MIM capacitance 209 is 100 pF in this example. Lines 211 having wire bonding are connected to the MIM capacitance 209, and a power source 212 controls a bias voltage of the differential negative resistance element 201. A frequency $f_{LC}$ of an LC resonance formed by an inductance $L_1$ of the strip conductor 206 of the microstrip line 208 and the capacitance C of the resonance unit 202 is approximately 0.08 THz.

Figure 3B:
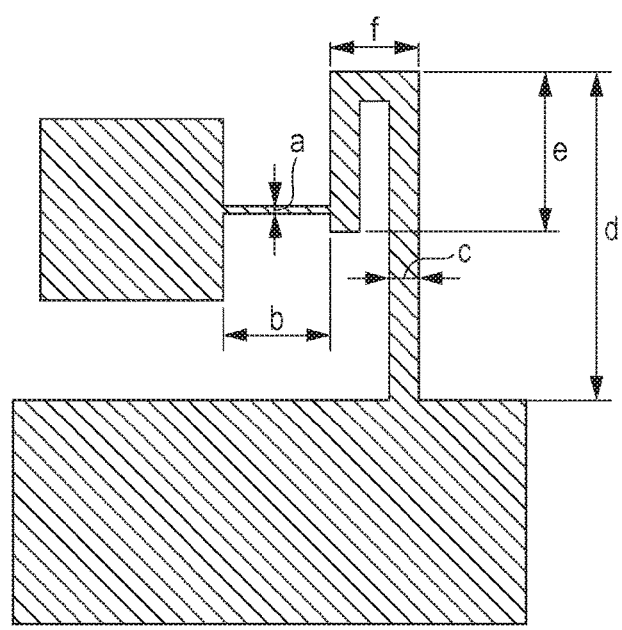
FIG. 3B is a top view of a line of the element according to the first example.

The line 208 includes the strip conductor 206, the grounding conductor 204, and a second dielectric body 205b disposed between the strip conductor 206 and the grounding conductor 204. The second dielectric body 205b is formed by silicon nitride having a thickness of approximately 0.1 μm. Impedance of the line 208 is smaller than an absolute value of a differential negative resistance of the RTD 201 in the frequency $f_{LC}$ of the LC resonance. FIG. 3B is a top view of the line 208. As a concrete size of the microstrip line of the line 208, a line having a width a of approximately 6 μm and a length b of approximately 100 μm extends from a portion connected to the resonance unit 202 and a line having a width c of approximately 20 μm and an entire length of approximately 600 μm further extends. The line having the width c of approximately 20 μm is connected to the MIM capacitance 209. The line having the width c of approximately 20 μm extends in a direction opposite to the MIM capacitance 209 by a length e, bends at an approximately right angle twice, and extends toward the MIM capacitance 209 by the length e. The length e is approximately 200 μm and the length d is approximately 400 μm. Furthermore, a distance f between the microstrip line having the length e and the microstrip line having the length d is approximately 60 μm.

The patch conductor 203 is connected to the conductor 207 at a node in a high-frequency electric field stably existing in the resonance unit 202 in an oscillation frequency $f_{THz}$ (=0.45 THz), and suppresses interference between the line 208 and a resonance electric field of terahertz waves in the oscillation frequency $f_{THz}$.

With this configuration, as is apparent from the result of the admittance analysis illustrated in FIG. 2, although the oscillation condition of Expression (1) is satisfied in the oscillation frequency $f_{THz}$, Expression (1) is not satisfied in a low frequency domain which includes the frequency $f_{LC}$ and which is equal to or larger than DC and smaller than $f_{THz}$ due to low impedance. Accordingly, low-frequency parasitic oscillation caused by the bias circuit and a power supply structure is suppressed in the oscillator 200, and the oscillator 200 may stably oscillate terahertz waves of the desired oscillation frequency $f_{THz}$ defined by the resonance unit 202 including the RTD 201 and the patch antenna.

The oscillator 200 is fabricated as follows. First, on the InP substrate 230, layers described below are newly developed by epitaxial growth by means of a molecular beam epitaxy (MBE) method or an organometallic vapor-phase epitaxy (MOVPE) method. Specifically, the resonant tunneling diode (RTD) 201 formed by n-InP/n-InGaAs and InGaAs/InAlAs in this order is subjected to epitaxial growth. When an n-type conductive substrate is selected as the InP substrate 230, the epitaxial growth is started from n-InGaAs.

Subsequently, the RTD 201 is etched in a mesa shape having an arch shape having a diameter of approximately 2 μm. As the etching, dry etching using EB (electric beam) lithography and ICP (inductive coupling plasma) is used. Alternatively, photolithography may be used. Thereafter, the grounding conductor 204 is formed on an etched surface by a lift-off process. A silicon nitride film having a thickness of approximately 0.1 μm is formed on the entire surface as a side wall protective film of the second dielectric body 205b and the resonant tunneling diode. Furthermore, embedding is performed using BCB which is the first dielectric body 205a by means of a spin coat method and the dry etching, and the patch conductor 203 of Ti/Pd/Au is formed by the lift-off method.

Next, the BCB outside the patch antenna is removed by the dry etching method so that the silicon nitride film having the thickness of 0.1 μm corresponding to the second dielectric body 205b is exposed. Electrodes are formed on upper portions of the conductor 207, the strip conductor 206, and the MIM capacitance 209 by the lift-off method. Finally, a Bi pattern is formed on a portion corresponding to a resistance 210 by the lift-off method, the grounding conductor 204 and an upper electrode of the MIM capacitance 209 are connected to each other, and the line 211 and the power source 212 are connected to each other by wire bonding. In this way, the oscillator 200 of this example is completed. Electric power is supplied from the bias circuit 220 to the oscillator 200. Normally, when a bias current is supplied by applying a bias voltage in the differential negative resistance region, the oscillator 200 operates.

In this example, the triple-barrier resonant tunneling diode formed by InGaAs/InAlAs and InGaAs/AlAs grown on the InP substrate has been described as the RTD 201. However, a structure and a material system of the RTD 201 are not limited to these, and the element of the present invention may be provided employing other structures and other combinations of materials. For example, a resonant tunneling diode having a double barrier quantum well structure or a resonant tunneling diode having multiple barrier quantum well structure, such as a quadruple barrier quantum well structure, may be employed.

As a material of such a resonant tunneling diode, one of the following combinations may be employed. —GaAs/AlGaAs, GaAs/AlAs, and InGaAs/GaAs/AlAs formed on a GaAs substrate —InGaAs/AlGaAsSb formed on an InP substrate —InAs/AlAsSb and InAs/AlSb formed on an InAs substrate —SiGe/SiGe formed on an Si substrate The structures and the materials described above are appropriately selected depending on a desired frequency, for example.

As described above, in the oscillator of this example, the oscillation circuit which has high impedance in the vicinity of the desired oscillation frequency $f_{THz}$ in a terahertz waveband and has low impedance in a frequency domain of parasitic oscillation which includes the LC resonance of the frequency $f_{LC}$ and which is equal to or larger than DC and smaller than the frequency $f_{THz}$ is realized. Accordingly, the oscillator of this example using the microstrip resonator may suppress low-frequency parasitic oscillation caused by a line structure of the bias circuit, the power supply structure, and the like and stably oscillate terahertz waves of the desired oscillation frequency $f_{THz}$.

Furthermore, since the stable terahertz waves of the oscillation frequency $f_{THz}$ may be obtained, terahertz waves of the desired oscillation frequency $f_{THz}$ in the microstrip resonator may be output at higher power.

SECOND EXAMPLE

Figure 4A:
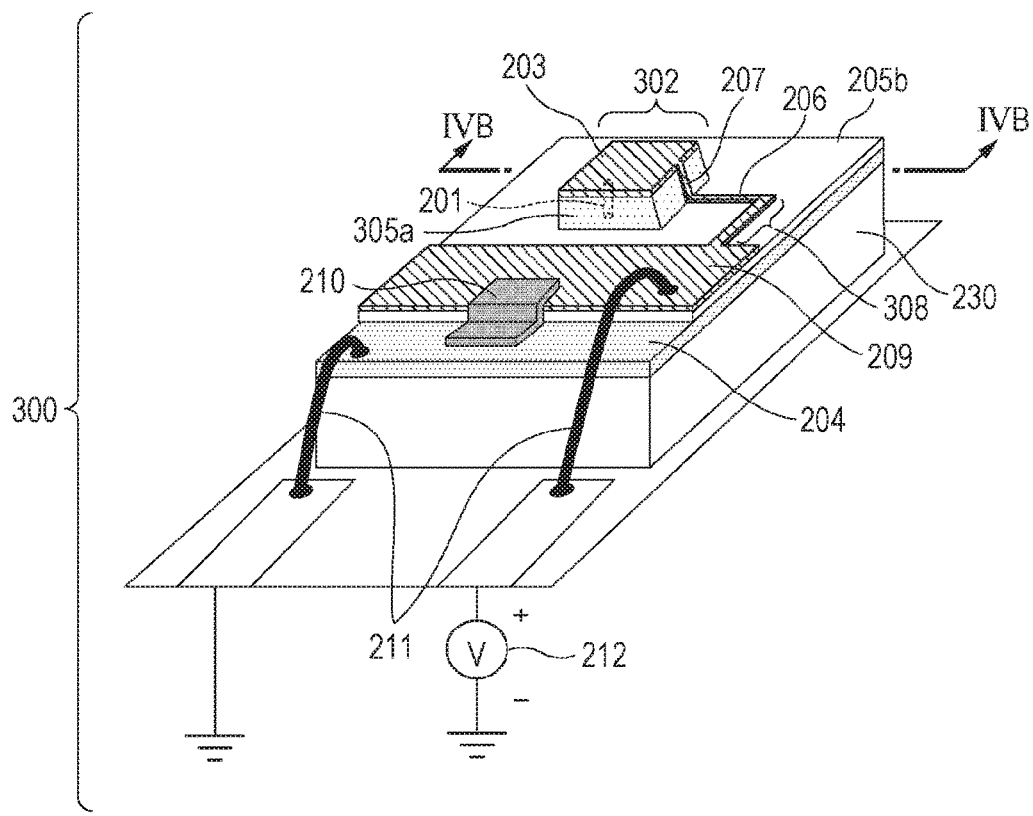
FIG. 4A is a perspective view of a configuration of an element of a first modification according to the first example.
Figure 4B:
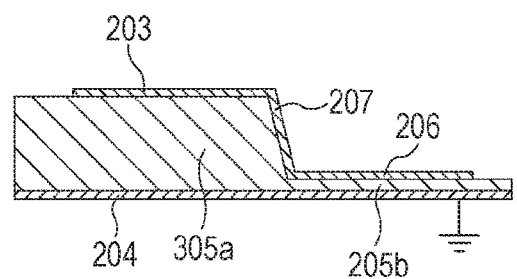
FIG. 4B is a sectional view of the element of the first modification according to the first example taken along a line IVB-IVB of FIG. 4A.

In a second example, elements of first to third modifications of the oscillator 200 according to the first example will be described. First, a structure of an oscillator 300 serving as an element of the first modification will be described with reference to FIGS. 4A and 4B. FIG. 4A is a perspective view of the element 300, and FIG. 4B is a sectional view of the element 300 taken along a line IVB-IVB of FIG. 4A. As with the oscillator 200, the oscillator 300 is an element which oscillates an oscillation frequency $f_{THz}$ of 0.45 THz. A structure of a resonance unit 302 of the oscillator 300 is different from that of the resonance unit 202 of the oscillator 200. Furthermore, a structure of a line 308 of the oscillator 300 is also different from that of the line 208 of the oscillator 200 according to the first example. The structure of the line is designed where appropriate. Other configurations are the same as those of the oscillator 200, and detailed descriptions thereof are omitted.

The resonance unit 302 includes the patch conductor 203, the grounding conductor 204, and a first dielectric body 305a disposed between the patch conductor 203 and the grounding conductor 204. A portion of a side wall of the first dielectric body 305a is not substantially orthogonal to the substrate 230, and an angle defined by the substrate 230 and the first dielectric body 305a is approximately 60 degrees. The patch conductor 203 is connected to the strip conductor 206 of the microstrip line serving as the line 208 through the fifth conductor 207.

The fifth conductor 207 is disposed on a slope which is tapered such that an angle defined by a portion of the first dielectric body 205a and the substrate 230 is approximately 60 degrees. The fifth conductor 207 is a plug used to cover a gap (difference in height) between the patch conductor 203 and the strip conductor 206. This configuration may reduce increase of resistance caused by defect of coverage of metal in a gap portion between the first and second dielectric bodies 305a and 205b which have different thicknesses.

Figure 5A:
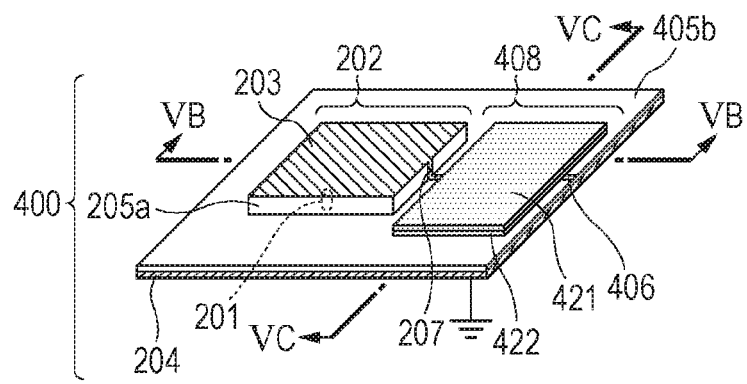
FIG. 5A is a perspective view of a configuration of an element of a second modification according to the first example.
Figure 5B:
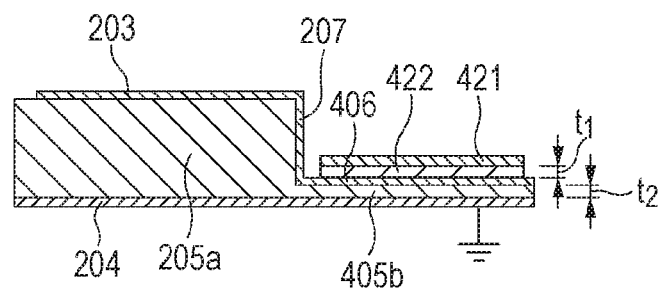
FIG. 5B is a sectional view of the element of the second modification according to the first example taken along a line VB-VB of FIG. 5A.
Figure 5C:
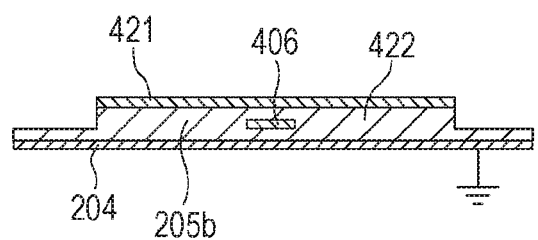
FIG. 5C is a sectional view of the element of the second modification according to the first example taken along a line VC-VC of FIG. 5A.

An oscillator 400 of the second modification of the oscillator 200 will be described. FIG. 5A is a perspective view of the oscillator 400, FIG. 5B is a sectional view of the oscillator 400 taken along a line VB-VB of FIG. 5A, and FIG. 5C is a sectional view of the oscillator 400 taken along a line VC-VC of FIG. 5A. The oscillator 400 which oscillates the oscillation frequency $f_{THz}$ of 0.45 THz uses a strip line serving as a distributed constant line of a line 408 used to connect the a resonance unit 402 and a bias circuit to each other. Other configurations are the same as those of the oscillator 200, and only important portions are described.

The line 408 of the oscillator 400 includes a strip conductor (third conductor) 406, a second dielectric body 405b, and a third dielectric body 422. The strip conductor 406 is embedded in a dielectric layer including the third dielectric body 422 having a thickness of $t_1$ and the second dielectric body 405b having a thickness of $t_2$. Furthermore, the dielectric layer is sandwiched between a sixth conductor 421 and the second conductor (fourth conductor) 204 in a vertical direction. The strip conductor 406 and the patch conductor 203 are electrically connected to each other through the fifth conductor 207.

The fifth conductor 207 is a plug used to cover a gap (difference in height) between the patch conductor 203 and the strip conductor 406, and the resonance unit 202 and the strip line 408 are coupled with each other by DC coupling. The sixth conductor 421 and the grounding conductor 204 may be electrically and physically connected to each other.

Figure 6:
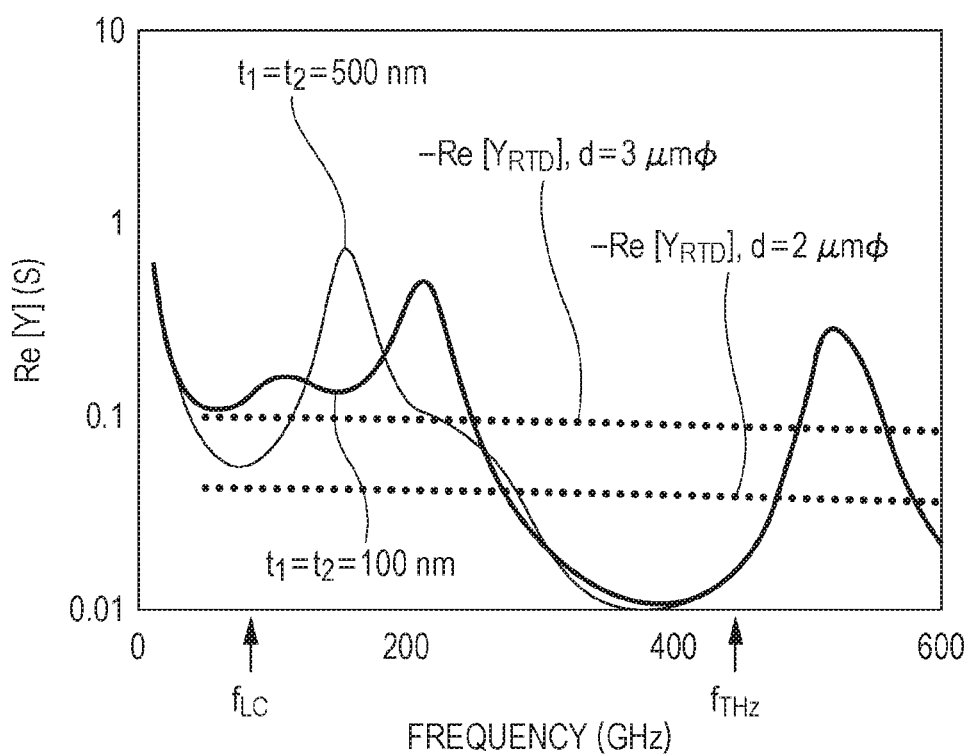
FIG. 6 is a diagram illustrating an admittance characteristic of the element of the second modification according to a second example.

An admittance characteristic of the oscillator 400 will now be described with reference to FIG. 6. FIG. 6 is a graph illustrating a result of analysis of the admittance characteristic of the oscillator 400 and plotting a real part Re[$Y_{RTD}$] of admittance of an RTD 401 which is a differential negative resistance element and a real part Re[$Y_{ANT}$] of admittance of the patch antenna. In the graph, as for the real part Re[$Y_{ANT}$] of the admittance of the antenna, results of analysis in two cases, that is, a case where a thickness of the dielectric layer including the third dielectric body 422 and the second dielectric body 405b satisfies an expression "t1=t2=100 nm" and a case where the thickness satisfies an expression "t1=t2=500 nm", are illustrated. Furthermore, as for a gain of the RTD 401, that is, the real part Re[$Y_{RTD}$] of the admittance, results of analysis in two cases, that is, a case where a diameter of the RTD 401 is 2 μm and a case where the diameter is 3 μm, are illustrated.

According to the graph, the impedance in a frequency band in the vicinity of the frequency $f_{LC}$ may be controlled by controlling a thickness of the dielectric layer (the third dielectric body 422 and the second dielectric body 405b) of the line 408. Note that the impedance in the frequency band in the vicinity of the frequency $f_{LC}$ may be controlled not only by controlling the thickness of the dielectric layer but also by selecting a length of the line 408 and materials of the second dielectric body 405b and the third dielectric body 422, and the selection is appropriately performed in accordance of the gain of the RTD 401. With the configuration of the oscillator 400, oscillation is suppressed in a low frequency domain equal to or larger than DC and smaller than the frequency $f_{THz}$ due to loss whereas the oscillation condition may be satisfied in the desired oscillation frequency $f_{THz}$ since the loss is small.

Figure 7A:
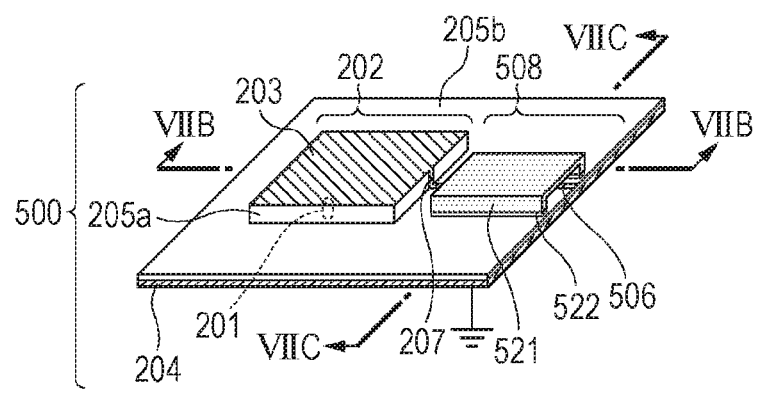
FIG. 7A is a perspective view of a configuration of an element of a third modification according to the second example.
Figure 7B:
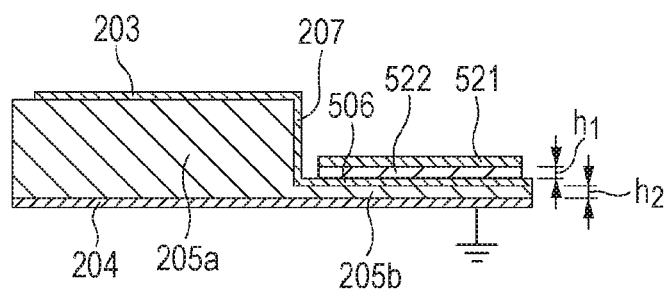
FIG. 7B is a sectional view of the element of the third modification according to the second example taken along a line VIIB-VIIB of FIG. 7A.
Figure 7C:
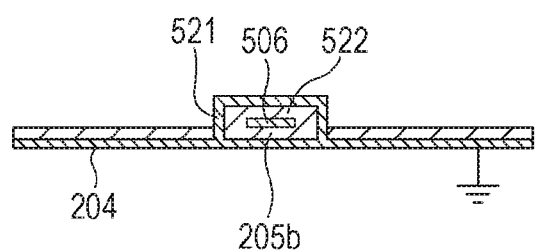
FIG. 7C is a sectional view of the element of the third modification according to the second example taken along a line VIIC-VIIC of FIG. 7A.

An oscillator 500 of the third modification of the first example will be described. FIG. 7A is a perspective view of the oscillator 500, FIG. 7B is a sectional view of the oscillator 500 taken along a line VIIB-VIIB of FIG. 7A, and FIG. 7C is a sectional view of the oscillator 400 taken along a line VIIC-VIIC of FIG. 7A. The oscillator 500 is an element which oscillates an oscillation frequency $f_{THz}$ of 0.45 THz. The oscillator 500 uses a rectangular coaxial line as a line 508 which connects a resonance unit 502 and a bias circuit to each other. Other configurations are the same as those of the oscillator 200, and therefore, detailed descriptions thereof are omitted and only important portions are described hereinafter.

The rectangular coaxial line of the line 508 is a distributed constant line. The line 508 includes a strip conductor (third conductor) 506, a sixth conductor 521, a third dielectric body 522, and a fourth conductor (grounding conductor) 204. The strip conductor 506 is embedded in a dielectric layer including the third dielectric body 522 having a thickness of $h_1$ and the second dielectric body 505b having a thickness of $h_2$, and the dielectric layer is surrounded by a conductive layer including the sixth conductor 521 and the fourth conductor 204. The strip conductor 506 and the patch conductor 203 are electrically connected to each other through the fifth conductor 207 which is a plug covering a gap (difference in height). The line 508 is a low impedance line using the absolute value of the differential negative resistance of the element 201 as a reference.

Figure 8:
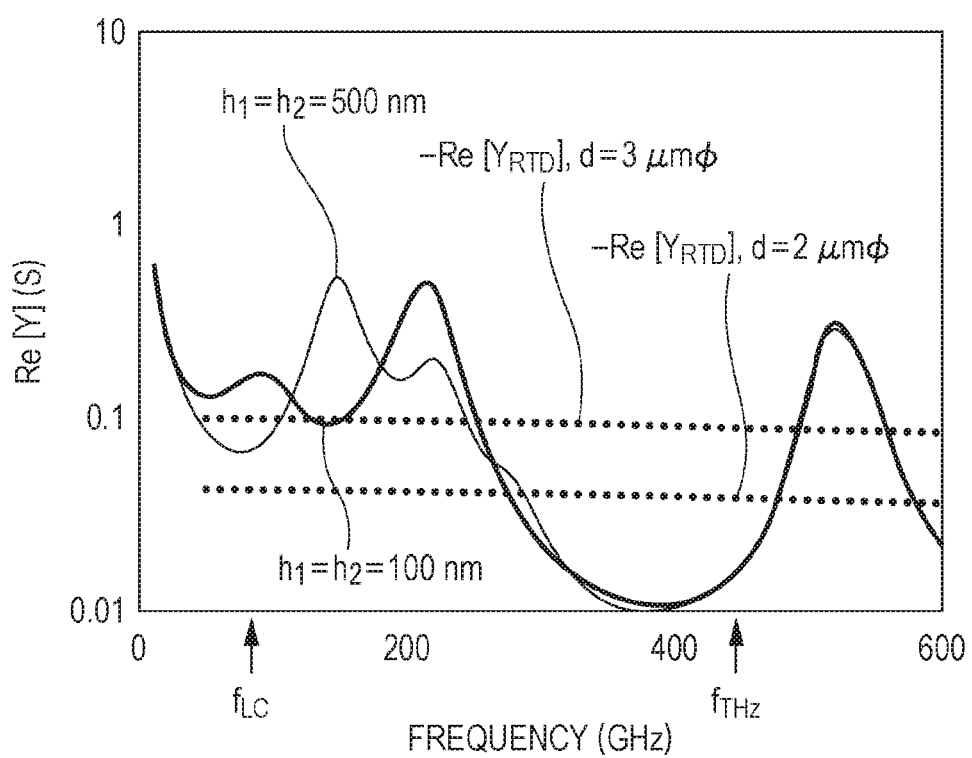
FIG. 8 is a diagram illustrating an admittance characteristic of the element of the third modification according to the second example.

An admittance characteristic of the oscillator 500 will now be described with reference to FIG. 8. FIG. 8 is a graph illustrating a result of analysis of the admittance characteristic of the oscillator 500 and plotting a real part Re[$Y_{RTD}$] of admittance of the RTD corresponding to the element 201 and a real part Re[$Y_{ANT}$] of admittance of the patch antenna. In the graph, as for the real part Re[$Y_{ANT}$] of the admittance of the antenna, results of analysis in two cases, that is, a case where a thickness of the dielectric layer including the third dielectric body 522 and the second dielectric body 205b satisfies an expression "h1=h2=100 nm" and a case where the thickness satisfies an expression "h1=h2=500 nm", are illustrated. Furthermore, as for a gain of the RTD, that is, the real part Re[$Y_{RTD}$] of the admittance, results of analysis in two cases, that is, a case where a diameter of the RTD is 2 µm and a case where the diameter is 3 µm, are illustrated.

According to the graph, the impedance in a frequency band in the vicinity of the frequency $f_{LC}$ may be controlled by controlling the thicknesses of the third dielectric body 522 and the second dielectric body 205b of the strip line 508. Note that the impedance in the frequency band in the vicinity of the frequency $f_{LC}$ may be controlled not only by controlling the thickness of the dielectric layer but also by selecting a length of the line 508 or materials of the second dielectric body 205b and the third dielectric body 522, and the selection is appropriately performed in accordance with the gain of the element 201. With the configuration of the oscillator 500, oscillation is suppressed in a low frequency domain equal to or larger than DC and smaller than the frequency $f_{THz}$ due to loss whereas the oscillation condition may be satisfied in the desired oscillation frequency $f_{THz}$ since the loss is small.

The first to third modifications of the oscillator 200 have been described hereinabove. Also in the first to third modifications described above, since the line which connects the resonance unit and the bias circuit to each other becomes a low impedance circuit using the absolute value of the differential negative resistance of the differential negative resistance element as a reference, parasitic oscillation caused by a line structure may be reduced. Consequently, terahertz waves in the desired oscillation frequency $f_{THz}$ may be stably oscillated.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

Although it is assumed that a carrier is an electron in the embodiment and the examples described above, for example, the present invention is not limited to this and a hole may be employed. Furthermore, materials of substrates and dielectric bodies are selected depending on the intended use, and a semiconductor, such as silicon, gallium arsenide, indium arsenide, and gallium phosphide, glass, ceramic, Teflon (registered trademark), and resin, such as polyethylene terephthalate, may be used.

Furthermore, although a square patch is used as a resonator for terahertz waves in the embodiment and the examples described above, a shape of the resonator is not limited to this and a resonator having a patch conductor of a polygonal shape, such as a rectangular shape or a triangular shape, circle, or an oval, may be used.

Furthermore, the number of differential negative resistance elements integrated in an oscillator is not limited to one, and a resonator may include a plurality of differential negative resistance elements. Moreover, the number of lines is also not limited to one, and a plurality of lines may be provided.

The oscillators described in the embodiment and the examples above may be used as detectors which detect terahertz waves. Furthermore, terahertz waves may be oscillated and detected using the oscillators described in the embodiment and the examples above.

The invention claimed is:

1. An element which oscillates or detects terahertz waves, the element comprising:
a resonance unit including a differential negative resistance element, a first conductor, a second conductor, and a first dielectric body;
a bias circuit configured to supply a bias voltage to the differential negative resistance element, the bias circuit including a resistance and capacitance, each of the resistance and the capacitance being electrically connected in parallel with the differential negative resistance element; and
a line configured to electrically connect the resonance unit and the bias circuit to each other,
wherein the differential negative resistance element and the first dielectric body are disposed between the first and second conductors,
the line includes a third conductor, a fourth conductor, a second dielectric body disposed between the third and fourth conductors,
the first conductor and the third conductor are electrically connected to each other,
a material of the first dielectric body and a material of the second dielectric body are different from each other, and
a width of the third conductor is smaller than a width of the first conductor.

2. The element according to claim 1, wherein
the second dielectric body includes a material having a larger dielectric tangent tan δ than a material of the first dielectric body.

3. The element according to claim 1, wherein
the second dielectric body includes a silicon nitride and the first dielectric body includes benzocyclobutene.

4. The element according to claim 1, wherein
a thickness of the second dielectric body is smaller than a thickness of the first dielectric body.

5. The element according to claim 2, wherein
a thickness of the second dielectric body is smaller than a thickness of the first dielectric body.

6. The element according to claim 1, wherein
the differential negative resistance element is a resonant tunneling diode.

7. The element according to claim 1, wherein
a width of the third conductor is equal to or smaller than one-tenth of a wavelength of the terahertz waves.

8. The element according to claim 1, wherein
dielectric loss of the line in a frequency of resonance caused by inductance of the line and capacitance of the resonance unit is equal to or larger than one-tenth of an absolute value of an inverse number of the differential negative resistance of the differential negative resistance element.

9. The element according to claim 8, wherein
the dielectric loss of the line in the frequency is equal to or larger than an absolute value of an inverse number of the differential negative resistance of the differential negative resistance element.

10. The element according to claim 1, wherein
a characteristic impedance of the line in a frequency of resonance caused by inductance of the line and capacitance of the resonance unit is equal to or smaller than a value ten times as large as the absolute value of the differential negative resistance of the differential negative resistance element.

11. The element according to claim 10, wherein
the characteristic impedance of the line in the frequency is equal to or smaller than the absolute value of the differential negative resistance of the differential negative resistance element.

* * * * *